US007167806B2

(12) United States Patent
Hamann et al.

(10) Patent No.: US 7,167,806 B2
(45) Date of Patent: Jan. 23, 2007

(54) METHOD AND SYSTEM FOR MEASURING TEMPERATURE AND POWER DISTRIBUTION OF A DEVICE

(75) Inventors: Hendrik F. Hamann, Yorktown Heights, NY (US); James A. Lacey, Mahopac, NY (US); Martin P. O'Boyle, Cortlandt Manor, NY (US); Robert J. von Gutfeld, New York, NY (US); Jamil A. Wakil, Wappingers Falls, NY (US); Alan J. Weger, Mohegan Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 53 days.

(21) Appl. No.: 10/919,692

(22) Filed: Aug. 17, 2004

(65) Prior Publication Data
US 2006/0039114 A1 Feb. 23, 2006

(51) Int. Cl.
*G06F 15/00* (2006.01)

(52) U.S. Cl. .................... 702/136; 702/60; 702/64; 702/136; 700/22; 361/601; 438/14; 324/451; 374/57; 374/178

(58) Field of Classification Search .............. 702/60, 702/64, 65, 99, 117, 130, 134, 186; 700/22; 361/601; 438/14; 324/451; 374/57, 178
See application file for complete search history.

(56) References Cited
U.S. PATENT DOCUMENTS
6,842,714 B1 * 1/2005 Acar et al. ................ 702/136

6,853,944 B2 * 2/2005 Fan .............................. 702/130
2005/0125174 A1 * 6/2005 Nam et al. ...................... 702/65

OTHER PUBLICATIONS

Deeney, 'Thermal Modeling and Measurement of Large High Power Silicon Devices with Asymmetric Power Distribution', Jan. 2000, HP Publication, pp. 1-7.*
Hamilton, 'Thermal Aspects of Burn-In of High Power Semiconductor Devices', 2002, IEEE Publication, pp. 626-634.*
Semenov et al., 'Burn-In Temperature Projections for Deep Sub-Micron Technologies', Jan. 2003, IEEE Publication, paper No. 4.3, pp. 95-104.*

* cited by examiner

*Primary Examiner*—Carol S. W. Tsai
*Assistant Examiner*—Elias Desta
(74) *Attorney, Agent, or Firm*—Jon A. Gibbons; Fleit, Kain, Gibbons, Gutman, Bongini & Bianco P.L.

(57) ABSTRACT

A present invention provides real-time temperature and power mapping of fully operating electronic devices. The method utilizes infrared (IR) temperature imaging, while an IR-transparent coolant flows through a specially designed cell directly over the electronic device. In order to determine the chip power distributions the individual temperature fields for each heat source of a given power and size on the chip (as realized by a scanning focused laser beam) are measured under the same cooling conditions. Then the measured chip temperature distribution is represented as a superposition of the temperature fields of these individual heat sources and the corresponding power distribution is calculated with a set of linear equations.

9 Claims, 16 Drawing Sheets

602
$P_{00} + P_{01} + P_{02} + \cdots\cdots P_{98} + P_{99} = P_{total}$

604 $\left\{ \begin{pmatrix} a_{00,00} & a_{00,01} & a_{00,02} + & \cdots\cdots & a_{00,98} & a_{00,99} \\ a_{01,00} & a_{01,01} & a_{01,02} + & \cdots\cdots & a_{01,98} & a_{01,99} \\ \vdots & \vdots & \vdots & & \vdots & \vdots \\ a_{99,00} & a_{99,01} & a_{99,02} + & \cdots\cdots & a_{99,98} & a_{99,99} \end{pmatrix} \begin{pmatrix} P_{00} \\ P_{01} \\ \\ \vdots \\ \\ P_{98} \end{pmatrix} = \begin{pmatrix} T_{00} \\ T_{01} \\ \\ \vdots \\ \\ T_{99} \end{pmatrix} \right.$ FROM BENCHMARKED MODELS AND/OR MEASURED   ?   MEASURED
WITH SINGLE HEAT SOURCE (E.G. LASER)

606 $\left\{ \begin{array}{l} a_{00,00} P_{00} + a_{00,01} P_{01} + a_{00,02} P_{02} + \cdots\cdots a_{00,98} P_{98} + a_{00,99} P_{99} = T_{00} \\ a_{01,00} P_{00} + a_{01,01} P_{01} + a_{01,02} P_{02} + \cdots\cdots a_{01,98} P_{98} + a_{01,99} P_{99} = T_{01} \\ \vdots \qquad\qquad \vdots \qquad\qquad \vdots \qquad\qquad\qquad \vdots \qquad\qquad \vdots \\ a_{99,00} P_{00} + a_{99,01} P_{01} + a_{99,02} P_{02} + \cdots\cdots a_{99,98} P_{98} + a_{09,99} P_{99} = T_{99} \end{array} \right.$

FIG. 6

```
Pro super_pos2;

;*** load/generate thermal impedance matrix all ***
all=fltarr(101,101,100)
p=fltarr(101,101)
status = dc_read_free('c:\trash\calibration\p01.neu', temp,x,y, /Column,
Get_Columns=[4,5,6])
q=0
for qi=0,10200 do begin
 xi=fix(x(q)/100)
 yi=fix(y(q)/100)
 p(xi,yi)=(temp(q)-273.15)/100
 q=q+2
end
all(*,*,0)=p(*,*)

status = dc_read_free('c:\trash\calibration\p02.neu', temp,x,y, /Column,
Get_Columns=[4,5,6])
q=0
for qi=0,10200 do begin
 xi=fix(x(q)/100)
 yi=fix(y(q)/100)
 p(xi,yi)=(temp(q)-273.15)/100
 q=q+2
end
all(*,*,1)=p(*,*)
all(*,*,10)=rotate(p,6)

status = dc_read_free('c:\trash\calibration\p03.neu', temp,x,y, /Column,
Get_Columns=[4,5,6])
q=0
for qi=0,10200 do begin
 xi=fix(x(q)/100)
 yi=fix(y(q)/100)
 p(xi,yi)=(temp(q)-273.15)/100
 q=q+2
end
all(*,*,2)=p(*,*)
all(*,*,20)=rotate(p,6)

status = dc_read_free('c:\trash\calibration\p04.neu', temp,x,y, /Column,
Get_Columns=[4,5,6])
q=0
for qi=0,10200 do begin
 xi=fix(x(q)/100)
 yi=fix(y(q)/100)
```

*FIG. 10a*

```
p(xi,yi)=(temp(q)-273.15)/100
q=q+2
end
all(*,*,3)=p(*,*)
all(*,*,30)=rotate(p,6)

status = dc_read_free('c:\trash\calibration\p05.neu', temp,x,y, /Column,
Get_Columns=[4,5,6])
q=0
for qi=0,10200 do begin
 xi=fix(x(q)/100)
 yi=fix(y(q)/100)
 p(xi,yi)=(temp(q)-273.15)/100
 q=q+2
end
all(*,*,4)=p(*,*)
all(*,*,40)=rotate(p,6)

status = dc_read_free('c:\trash\calibration\p12.neu', temp,x,y, /Column,
Get_Columns=[4,5,6])
q=0
for qi=0,10200 do begin
 xi=fix(x(q)/100)
 yi=fix(y(q)/100)
 p(xi,yi)=(temp(q)-273.15)/100
 q=q+2
end
all(*,*,11)=p(*,*)

status = dc_read_free('c:\trash\calibration\p13.neu', temp,x,y, /Column,
Get_Columns=[4,5,6])
q=0
for qi=0,10200 do begin
 xi=fix(x(q)/100)
 yi=fix(y(q)/100)
 p(xi,yi)=(temp(q)-273.15)/100
 q=q+2
end
all(*,*,12)=p(*,*)
all(*,*,21)=rotate(p,6)

status = dc_read_free('c:\trash\calibration\p14.neu', temp,x,y, /Column,
Get_Columns=[4,5,6])
q=0
for qi=0,10200 do begin
 xi=fix(x(q)/100)
```

*FIG. 10b*

```
yi=fix(y(q)/100)
p(xi,yi)=(temp(q)-273.15)/100
q=q+2
end
all(*,*,13)=p(*,*)
all(*,*,31)=rotate(p,6)

status = dc_read_free('c:\trash\calibration\p15.neu', temp,x,y, /Column,
Get_Columns=[4,5,6])
q=0
for qi=0,10200 do begin
xi=fix(x(q)/100)
yi=fix(y(q)/100)
p(xi,yi)=(temp(q)-273.15)/100
q=q+2
end
all(*,*,14)=p(*,*)
all(*,*,41)=rotate(p,6)

status = dc_read_free('c:\trash\calibration\p23.neu', temp,x,y, /Column,
Get_Columns=[4,5,6])
q=0
for qi=0,10200 do begin
xi=fix(x(q)/100)
yi=fix(y(q)/100)
p(xi,yi)=(temp(q)-273.15)/100
q=q+2
end
all(*,*,22)=p(*,*)

status = dc_read_free('c:\trash\calibration\p24.neu', temp,x,y, /Column,
Get_Columns=[4,5,6])
q=0
for qi=0,10200 do begin
xi=fix(x(q)/100)
yi=fix(y(q)/100)
p(xi,yi)=(temp(q)-273.15)/100
q=q+2
end
all(*,*,23)=p(*,*)
all(*,*,32)=rotate(p,6)

status = dc_read_free('c:\trash\calibration\p25.neu', temp,x,y, /Column,
Get_Columns=[4,5,6])
q=0
for qi=0,10200 do begin
```

*FIG. 10c*

```
xi=fix(x(q)/100)
yi=fix(y(q)/100)
p(xi,yi)=(temp(q)-273.15)/100
q=q+2
end
all(*,*,24)=p(*,*)
all(*,*,42)=rotate(p,6)

status = dc_read_free('c:\trash\calibration\p34.neu', temp,x,y, /Column,
Get_Columns=[4,5,6])
q=0
for qi=0,10200 do begin
 xi=fix(x(q)/100)
 yi=fix(y(q)/100)
 p(xi,yi)=(temp(q)-273.15)/100
 q=q+2
end
all(*,*,33)=p(*,*);

status = dc_read_free('c:\trash\calibration\p35.neu', temp,x,y, /Column,
Get_Columns=[4,5,6])
q=0
for qi=0,10200 do begin
 xi=fix(x(q)/100)
 yi=fix(y(q)/100)
 p(xi,yi)=(temp(q)-273.15)/100
 q=q+2
end
all(*,*,34)=p(*,*)
all(*,*,43)=rotate(p,6);

status = dc_read_free('c:\trash\calibration\p45.neu', temp,x,y, /Column,
Get_Columns=[4,5,6])
q=0
for qi=0,10200 do begin
 xi=fix(x(q)/100)
 yi=fix(y(q)/100)
 p(xi,yi)=(temp(q)-273.15)/100
 q=q+2
end
all(*,*,44)=p(*,*);

; * mirror thermal impedance matrix * for f=5,9 do begin
 all(*,*,f)=rotate(all(*,*,9-f),5)
```

*FIG. 10d*

```
end for f=5,9 do begin
 all(*,*,f+10)=rotate(all(*,*,19-f),5)
end for f=5,9 do begin
 all(*,*,f+20)=rotate(all(*,*,29-f),5)
end for f=5,9 do begin
 all(*,*,f+30)=rotate(all(*,*,39-f),5)
end for f=5,9 do begin
 all(*,*,f+40)=rotate(all(*,*,49-f),5)
end for f=0,9 do begin
 all(*,*,50+f)=rotate(all(*,*,40+f),7)
end for f=0,9 do begin
 all(*,*,60+f)=rotate(all(*,*,30+f),7)
end for f=0,9 do begin
 all(*,*,70+f)=rotate(all(*,*,20+f),7)
end for f=0,9 do begin
 all(*,*,80+f)=rotate(all(*,*,10+f),7)
end for f=0,9 do begin
 all(*,*,90+f)=rotate(all(*,*,f),7)
end ;*** rotate matrix so that P0 corresponds to 0,0 position
for f=0,99 do begin
all(*,*,f)=rotate(all(*,*,f),7)
end ;for f=0,99 do begin
; print,f,max(all(*,*,f))
;end
```

*FIG. 10e*

```
;LOADCT,15,/Silent
;TVLCT,red_vector,green_vector,blue_vector,/Get
;cmap=bytarr(3,256)
;cmap(0,*)=red_vector
;cmap(1,*)=green_vector
;cmap(2,*)=blue_vector ;*** print images of individual temperature fields
;for f=0,99 do begin
; ima=image_create(byte((all(*,*,f)-
min(all))/max(all)*255),colormap=cmap,File_type='gif')
; if f LT 10 then name1='c:\trash\calibration\temporary\p0'
; if f GT  9 then name1='c:\trash\calibration\temporary\p'
; name=strcompress(name1+string(f)+'.gif',/remove_all)
; status=image_write(name,ima)
;end ; * power matrix **
status=dc_read_fixed('c:\trash\calibration\power.txt',power)
; *** generate power matrix without reform command....
;info,power
;power=fltarr(100)
;power(*)=0
;power(0)=100
;power(9)=80
;power(90)=60
;power(99)=40 powera=fltarr(10,10)
q=0
for fy=0,9 do begin
 for fx=0,9 do begin
  powera(fx,fy)=power(q)
  q=q+1
 end
end ; * calculate superimposed temperature distribution *
tsuper=fltarr(101,101)
tsuper(*,*)=0
for f=0,99 do begin
 tsuper(*,*)=all(*,*,f)*power(f)+tsuper(*,*)
end ;*** print superimposed temperature distribution
```

*FIG. 10f*

```
; ima=image_create(byte((tsuper-
min(tsuper))/max(all)*255),colormap=cmap,File_type='gif')
; if f LT 10 then name1='c:\trash\calibration\temporary\p0'
; if f GT 9 then name1='c:\trash\calibration\temporary\p'
; name=strcompress(name1+string(f)+'.gif',/remove_all)
; status=image_write(name,ima)

; *** load FE calculated temperature distribution ***
fe=fltarr(101,101)
status = dc_read_free('c:\trash\calibration\fe.neu', temp,x,y, /Column,
Get_Columns=[4,5,6],Delim=' ')
q=0
for qi=0,10200 do begin
xi=fix(x(q)/100)
yi=fix(y(q)/100)
p(xi,yi)=(temp(q)-273.15)
q=q+2
end
fe(*,*)=rotate(p(*,*),7)

; **** reduce to 10 x 10 x 100 ****....congrid....rebin does not work
; **** thermal impedance matrix
allr=fltarr(10,10,100)
for f=0,99 do begin
 for fy=0,9 do begin
  for fx=0,9 do begin
   allr(fx,fy,f)=avg(all(fx*10:(fx+1)*10,fy*10:(fy+1)*10,f))
   end
  end
 end ; *** fer reduced calculated matrix
fer=fltarr(10,10)
for fy=0,9 do begin
 for fx=0,9 do begin
  fer(fx,fy)=avg(fe(fx*10:(fx+1)*10,fy*10:(fy+1)*10))
  end
 end ; *** tsuperr reduced superimposed temperature distribution
tsuperr=fltarr(10,10)
tsuperr(*,*)=0
for f=0,99 do begin
 tsuperr(*,*)=allr(*,*,f)*power(f)+tsuperr(*,*)
 end
```

*FIG. 10g*

```
;wzimage,powera
;wzimage,tsuperr

; *** linear set of equations
; *** tsuperr(10,10) reduced superimposed temperatures
; *** fer(10,10) FE calculated temperatures
; *** allr(10,10,100) thermal impdedance matrix
; *** ti(10,10) thermal impedance matrix
; *** mat/mata is ti#power ti=fltarr(100,100)
for f=0,99 do begin
 q=0
 for fy=0,9 do begin
  for fx=0,9 do begin
   ti(q,f)=allr(fx,fy,f)
   q=q+1
  end
 end
end mat=ti#power                         this is where we solve the set of linear equations
mata=fltarr(10,10)
q=0
for fy=0,9 do begin
 for fx=0,9 do begin
  mata(fx,fy)=mat(q)
  q=q+1
 end
end ;wzimage,powera
wzimage,tsuperr
;wzimage,fer
;wzimage,mata ; *** can we solve for power map
; *** make a temperature vector
temp=fltarr(100)
q=0
for fy=0,9 do begin
 for fx=0,9 do begin
  temp(q)=tsuperr(fx,fy)
  q=q+1
 end
end
```

*FIG. 10h* tarr = ti
rvec = temp
LUDCMP, tarr, index, b
LUBKSB, tarr, index, rvec
s=rvec
wzimage,powera
wzimage,reform(s,10,10)

end

*FIG. 10i*

METHOD AND SYSTEM FOR MEASURING TEMPERATURE AND POWER DISTRIBUTION OF A DEVICE

BACKGROUND OF THE INVENTION

1. Field of the Invention

This invention relates in general to power distributions of an electronic device and more particularly, to a method of real-time temperature and power mapping of fully operating electronic devices such as microprocessors and alike.

2. Description of the Related Art

As power densities of electronic devices, including active, passive and highly integrated circuits continue to increase, low-power designs and pre-silicon modeling tools are becoming increasingly crucial for electronic device development. The ability to continue to improve chip and system performance for future products will directly depend on the development of an understanding of power dissipation and thermal distributions. Towards this end, a key technical challenge involves the optimization of circuit designs and software tools to avoid excessive power consumption and non-uniformities in the heat load.

While substantial progress in modeling of temperature and power distributions of electronic devices has been made, detailed and quantitative experimental measurements for verifying these models and the resulting design rules are not available. In order to address these shortcomings, a need exists for "real-time" temperature and power mapping of fully operating electronic device chips. The commonly assigned, co-pending U.S. application Ser. No. 10/699,399 now [Pending], filed on Oct. 30, 2003 entitled "Transparent Cooling Duct" with is hereby incorporated by reference in its entirety. Further is the commonly assigned, co-pending U.S. application Ser. No. 10/699,123 now [Pending], filed on Oct. 30, 2003 entitled "Thermal Measurement of Electronic Devices During Operation" with which is hereby incorporated by reference in its entirety. Neither the nor the patent applications expressly disclose how to convert the measured temperature distributions to power distributions.

SUMMARY OF THE INVENTION

Briefly, in accordance with the present invention, disclosed is a method and apparatus comprising IR (infra-red) temperature imaging (or other forms of photon detection) of an electronic device while an IR-transparent liquid (e.g. hexane or perfluoro-octane) flows directly over the chip through a specially designed cooling cell with a transparent window. The cooling cell fulfills two goals: First, the heat removal rates are tunable up to ~200 Watts/cm$^2$, which allows for systematic investigation of the thermal distributions as a function of the heat sinking conditions. Furthermore, these high heat removal rates effectively prevent thermal spreading in the electronic device and as a result, the measured temperature distribution closely represents the chip power distribution. Second, the cooling cell provides a heat removal rate that is approximately uniform and reproducible across the chip. This ensures that the measured thermal distributions can be readily interpreted and power maps can be extracted. The details of this cooling cell is described in the following two, the commonly assigned, co-pending U.S. application Ser. No.: 10/699,399 now [Pending], filed on Oct. 30, 2003 entitled "Transparent Cooling Duct" with, which is hereby incorporated by reference in its entirety and U.S. application Ser. No. 10/699, 399 now [Pending], filed on Oct. 30, 2003 entitled "Thermal Measurements of Electronic Devices During Operation" with, which is hereby incorporated by reference in its entirety. The temperature distributions, which can be measured using the apparatus and method described in and are a function of both: the power distribution of the electronic device and the thermal character of the package of the electronic device. In order to convert the temperature distributions to power distributions two steps are involved: a.) systematically thermally characterize the package of the electronic device and b.) to convert the temperature distributions to power distributions. Consequently, there are two aspects to this invention. In a first aspect, the present invention provides a method and apparatus to systematically thermally characterize a package along with a device. More specifically, for (n·m) temperatures for the package, a heat source with an appropriate size and given power is applied to several regions, preferably at least (n·m)−1 regions. In a second aspect of the present invention, disclosed is a method and apparatus to convert temperature distributions of an electronic device to power distributions. Specifically, in order to determine the chip power distributions, both the package which is thermally coupled to an electronic device is thermally characterized, which permits the determination of the underlying power distribution of a device such as a microprocessor. Specifically, the present invention provides a method for characterizing systematically a package with the attendant electronic device. The individual temperature fields for each heat source of a given power and size on the chip (for example, as realized by a scanning focused laser beam) are measured under the same cooling conditions. Then the measured chip temperature distribution is represented as a superposition of the temperature fields of these individual heat sources. As a result, the corresponding power map can be calculated by solving a linear set of equations.

BRIEF DESCRIPTION OF THE DRAWINGS

The accompanying figures where like reference numerals refer to identical or functionally similar elements throughout the separate views and which together with the detailed description below are incorporated in and form part of the specification, serve to further illustrate various embodiments and to explain various principles and advantages all in accordance with the present invention.

FIG. 6 is a set of exemplary linear equations in accordance with the present invention.

FIG. 10 is an exemplary Fortran code for solving the linear equations of FIG. 6, according to the present invention

DETAILED DESCRIPTION OF THE PREFERRED EMBODIMENT

Figure 1:
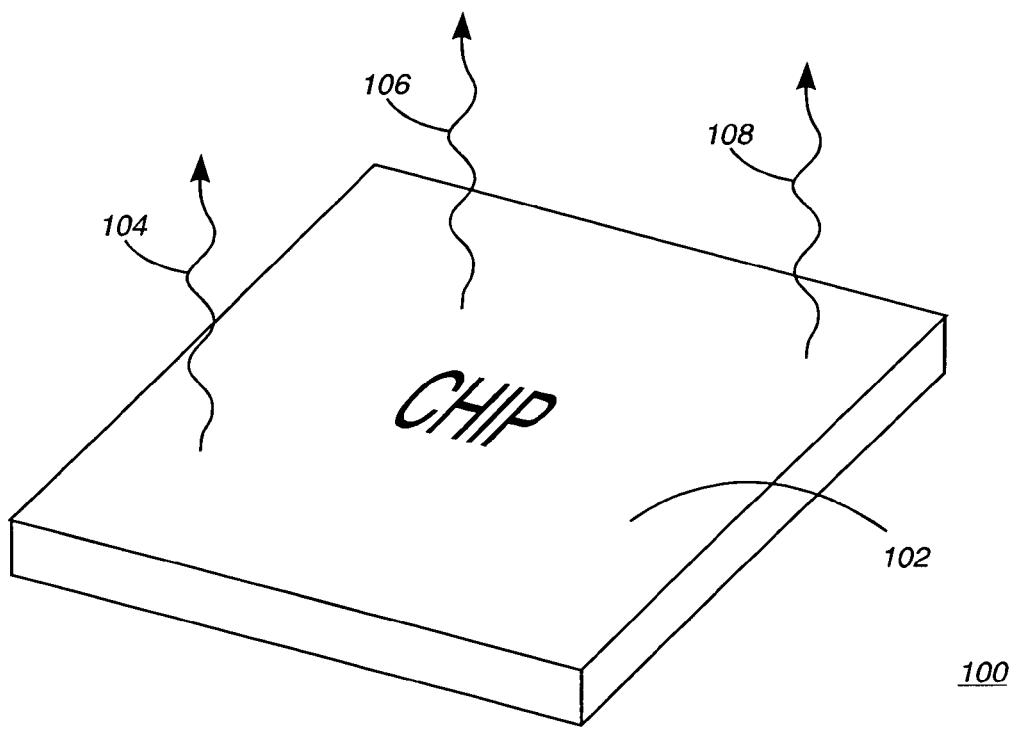
FIG. 1 is a block diagram illustrating an electronic device, under load and emanating heat, according to the present invention.

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality. In the drawing like numerals refer to like parts through several views.

While the specification concludes with claims defining the features of the invention that are regarded as novel, it is believed that the invention will be better understood from a consideration of the following description in conjunction with the drawing FIGS., in which like reference numerals are carried forward.

The Device

Described now is an exemplary embodiment of the present invention. FIG. 1 shows electronic device 100, having a top surface 102 emanating heat, according to the present invention. In the drawing of FIG. 1 the circuitry level is thought to be at the bottom surface of the chip and the substrate level is thought to be the top surface. In a typical application the heat is removed from the substrate or back side of the chip (maybe we can add numbers). The particular device shown is an electronic device composed of passive (e.g. resistors, diodes, capacitors and inductors) and/or active components (e.g. transistors). The electronic device includes memory devices, dedicated and general purpose microprocessors, microcontrollers and alike. These electronic devices are constructed over organic and inorganic circuits with internal communication paths using electric current and/or light and/or other electromagnetic waves. Heat emanations are shown as arrows 104, 106 and 108 rising from the device 100. Note that heat 104, 106 and 108 originates from different locations on the top surface 102 of electronic device 100. Heat is a product of power dissipation within the device 100 under operating conditions, and therefore heat increases in proportion to power.

Distribution of Heat and Power

Figure 2:
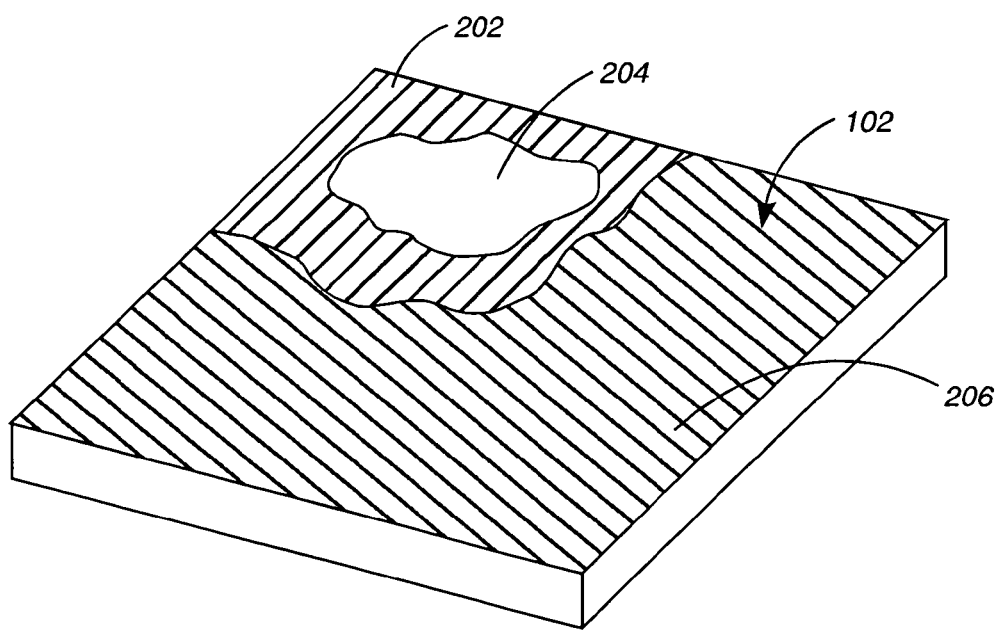
FIG. 2 is an exemplary graphical representation of a thermal distribution generated by the electronic device of FIG. 1 according to the present invention.

FIG. 2 is an exemplary graphical representation of a temperature distribution generated by the device in FIG. 1 according to the present invention. FIG. 2 shows how the temperature distribution can be represented graphically to show temperature distributions on the top surface 102 of the electronic device 100. In FIG. 2, the top surface 102 of the electronic device 100 is divided into three different shaded areas 202, 204, and 206. Each shaded area 202, 204, and 206 refers to a temperature interval. For example, shaded area 202 may refer to a temperature interval of about 50–75 degrees Centigrade, shaded area 204 may refer to a temperature interval of about 25–50 degrees Centigrade and shaded area 206 may refer to a temperature interval of about 10–25 degrees Centigrade. In this way, the graphical representation of FIG. 2, based on a temperature profile, shows the locations of different temperatures on the top surface 102 of the electronic device 100.

As described above, shaded area 202 may refer to a temperature interval of about 50–75 degrees Centigrade— the highest temperature interval present on the top surface 102 of the electronic device 100. Thus, in relation to the other temperatures on the top surface 102 of the electronic device 100, area 202 represents the highest concentration of heat dissipation, known as a "hot spot".

For simplicity, FIG. 2 shows only three temperature intervals. In reality, a temperature distribution has a much more complex differential across a face of the chip. For this reason, a measured distribution will be more precise as the granularity of the testing method is reduced.

A challenge in the development and design of electronic devices is the avoidance of excessive power consumption and non-uniformities in heat and power loads.

The Method and Apparatus

It will now be shown that for the first time, real-time temperature and power mapping of a fully operating device is possible. The present invention allows real-time chip power distributions to be determined by measuring individual temperature fields for each region of a device that a heat source of a given power and size is applied under the same cooling conditions. Then a measured chip temperature distribution can be represented as a superposition of the temperature fields of these individual heat sources, from which the corresponding power distribution can be calculated. The method allows the power distribution to be realized by the simple solution of a set of n+1 linear equations with n unknown variables.

As will be apparent from the following discussion, an external heat source of a given power and size and method and device for measuring the resultant temperature will yield the n values for solving the n+1 linear equations with n unknown variables (i.e., the individual power sources).

Cooling and Measuring Temperature

One method of measuring thermal distributions of fully operating computer chips has been taught in the commonly assigned, co-pending U.S. application Ser. No. 10/699,123 now [Pending], filed on Oct. 30, 2003 entitled "Thermal Measurement of Electronic Devices During Operation" with, which is hereby incorporated by reference in its entirety.

Figure 3:
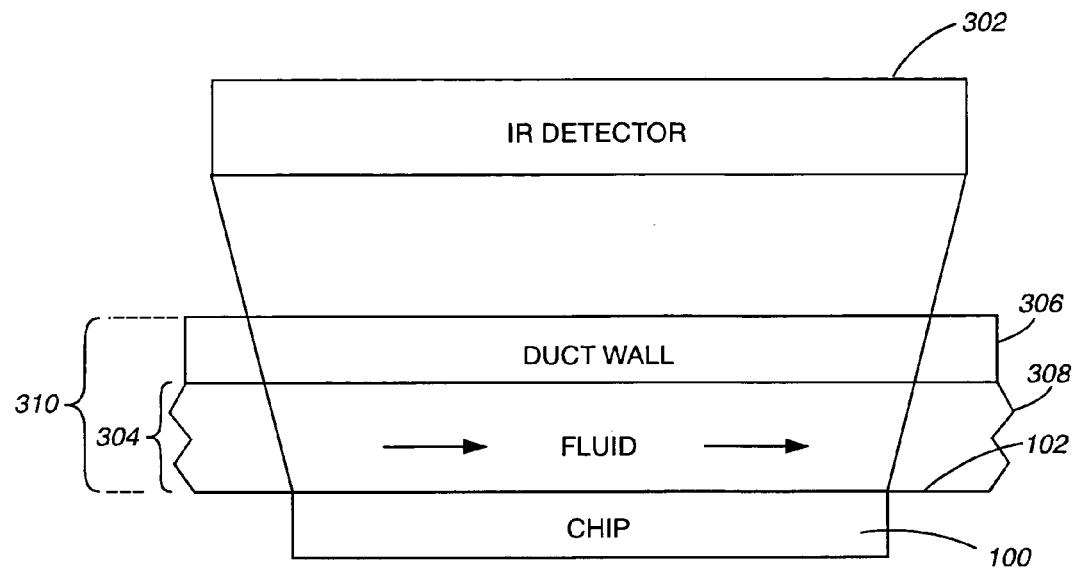
FIG. 3 is a cross sectional diagram of the present invention with the electronic device of FIG. 1 being measured, according to the present invention.

FIG. 3 is a cross sectional diagram depicting one embodiment of the present invention. FIG. 3 shows a cross section of the system of an electronic device package. FIG. 3 shows also a temperature detector, such as an infrared camera 302 and a duct 304. In another embodiment a photon-detector detects photons comprising the luminescence from the electronic device. It is important to note that although infrared detection 302 is shown in this embodiment using a camera, other types of photon detection and photon detectors are within the true scope and spirit of the present invention. For example, in some cases it may be preferred to use thermal reflectance to monitor the temperature of the electronic device. Specifically, the photo detector detects the amount of reflected photons from the electronic device 100, which changes optical reflectivity with temperatures.

Attached to the electronic device is a heat sink 310, which includes a duct 304 formed by a duct wall 306 above and the bottom part of the duct 304 is typically the top surface 102 of the electronic device 100. The duct preferably spans over the entire top surface 102. Within the duct 304 is a fluid 308 that flows over the top surface 102 of the electronic device 100 in order to cool the electronic device 100. In one embodiment, the cooling rates are adjustable up to 200 Watts/cm$^2$ with a corresponding temperature increase of 70 degrees C. above ambient. In one embodiment, the height of duct 304 is about 0.1–20 mm. Typically, it is preferred to lower the duct height in order to increase the optical transmission of the IR camera 302 through the duct 304 and fluid 308.

In one embodiment the duct wall 306 of the duct 304 and the fluid 308 are at least semi-transparent to infrared radiation. This allows the infrared camera 302 to gather thermal information and position information of the electronic device 100. In one embodiment of the present invention the duct wall 306 comprises polished silicon, quartz, sapphire or diamond. In another embodiment of the present invention, the fluid 308 comprises water or a cold gas. Alternatively, the fluid 308 comprises a non-polar liquid such as perflourooctane, perflouro-hexane, octane, or hexane. Fluid 308 may also comprise at least one of any alkanes and perflouroalkanes. Fluid 308 may also be transparent to infrared radiation.

In another embodiment of the present invention, alternative optical temperature sensing techniques, other than infrared camera 302, could be implemented, such as thermal reflectance, fluorescence imaging etc. The function of illustrative infrared camera 302 is to capture thermal information of the electronic device 100 during operation of electronic device 100. More specifically, infrared camera 302 may capture thermal information of the top surface 102 of the electronic device 100 as a function of position. Thus, the infrared camera 302 captures and records thermal information and position information for each temperature reading. This allows the generation of a thermal profile of the top surface 102 of the electronic device 100. In some cases it may be preferred to thin the electronic device in order to image closer to the device level of the electronic device.

Heat Source

Figure 4:
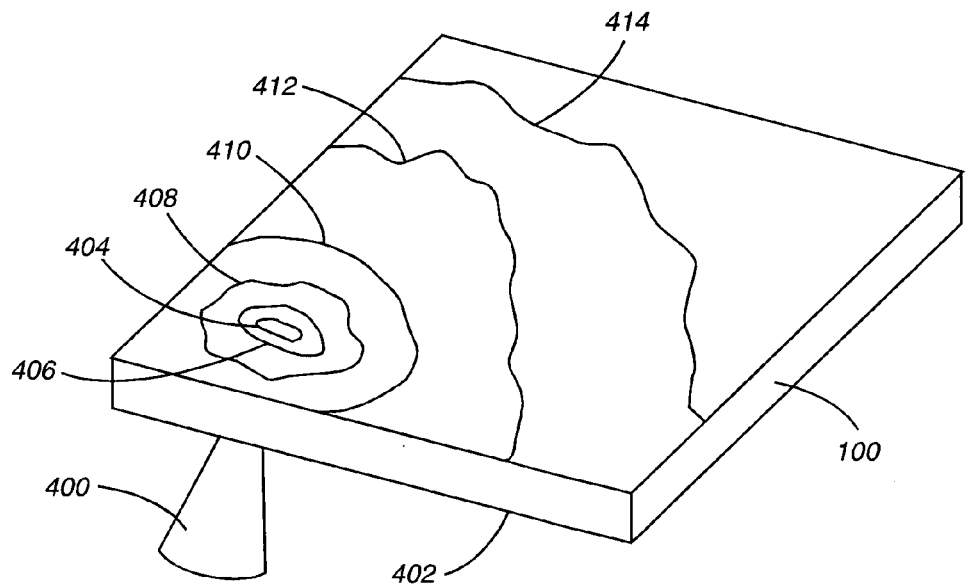
FIG. 4 is a block diagram illustrating the application of a heat source of a given power and size to the electronic device chip of FIG. 1, according to the present invention.

Referring now to FIG. 4, a heat source of a given power and size 400 is shown being applied to a bottom surface 402 of device 100. It is also important to note that in one embodiment, the temperature distribution is measured on a thermally-equivalent device in lieu of the actual device itself. For example, in some cases it may be easier to use a plain piece of Si of equal thickness and size. Different coatings, which are thin enough not to influence the thermal properties, can help to absorb a laser beam at different locations of the electronic device. We also like to mention that the power of the heat source is given but it does not has to be necessarily constant as long as the magnitudes or the relative changes in the power are known Further, it is important to note that the heat source in another embodiment is applied from to the top surface 102 through cooling duct 304. Because the heat duct is at least semi-transparent, the duct passes substantially all of the heat without absorbing it in the duct. The heat source of a given power and size 400 shown in FIG. 4 is a focused laser beam, however, many other, techniques and devices of applying a heating power to the device 100 will work equally as well to realize the objects of the present invention including contact and non contact heating methods working by heat convection, heat conduction or heat radiation or a combination of all three. These heating methods include directed electromagnetic radiations such as laser, resistive heaters, and directed convention flow. The choice where and how the heat source is applied depends on the details of the measurement. For example, if the temperature distribution of a chip has been measured on the top as indicated in FIG. 4, but the power sources are at the frontside of the chip (circuitry level), the heat source is applied to the bottom side and the temperature fields are measured on the top side. In some cases it may be preferred to thin the thickness of the electronic device.

Further we like to mention that this method and apparatus can be used to determine the temperature distributions in other layers of the chip once we have determined the power distribution of the electronic device. For example, in one embodiment, the temperature fields are measured at circuitry level (bottom side) for each individual power source applied at the circuitry level and the use the power distribution of the chip to determine the temperature distribution of the chip at circuitry level.

As is shown in the FIG., an area 404 of the top surface 102 of device 100 is heated as a result of the application of the heat source of a given power and size 400 to a corresponding region on the bottom surface 402 of device 100. As can also be seen in FIG. 4, an adjacent area 406 is affected by the application of the laser 400. The rings shown in FIG. 4 separating areas 404 and 406 define temperature intervals, as described in connection with and shown in FIG. 2. Additionally shown rings 408, 410, 412, and 414 also define further temperature intervals resulting from application of the heat source of a given power and size 400.

Figure 5:
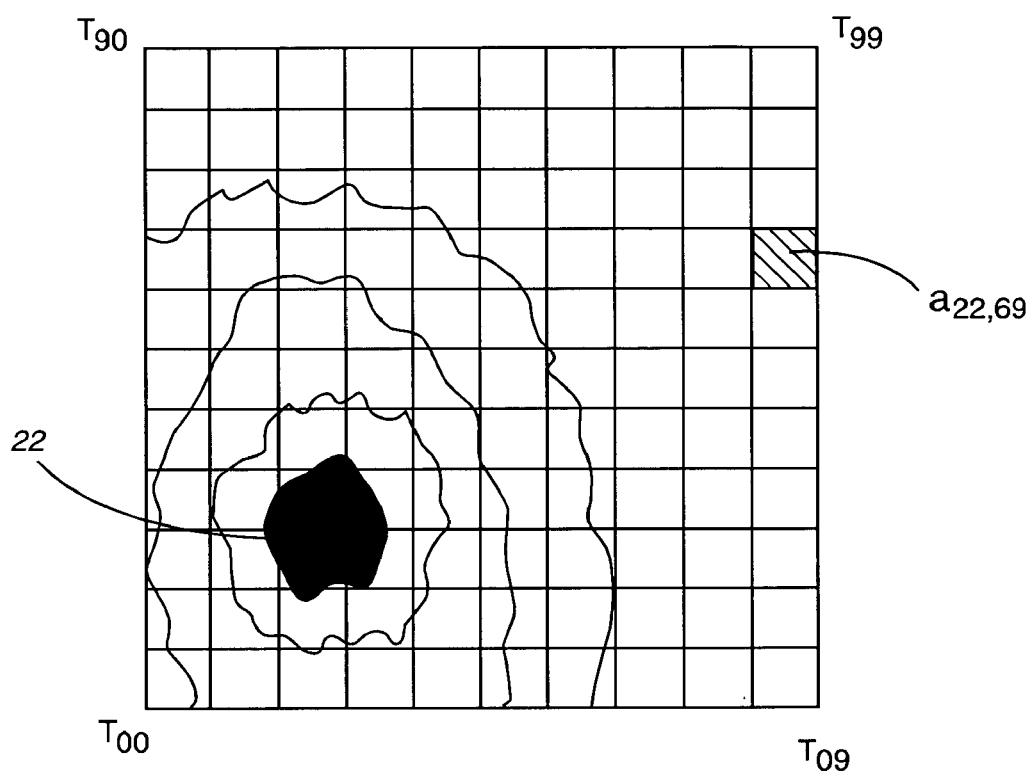
FIG. 5 is a graphical illustration showing the distribution of heat across regions on the electronic device chip, according to the present invention.

Regions:

In one embodiment, the method and apparatus of the present invention is realized by theoretically dividing the device 100 into a plurality of regions. As shown in FIG. 5, 100 equally sized regions span the device 100. It is important to note that the number of regions can be any number from two regions to n regions, and the number of 100 regions in the present embodiment is purely exemplary. The regions are envisioned as traveling through the device from the top surface 102 to the bottom surface 402. As the heat source of a given power and size 400 is applied to a particular region on the bottom surface 402, the resultant temperature of its corresponding region on the upper surface 102 is measured with the infrared camera 302, described above. Appling heat source of a given power and size 400 to all 100 regions shown in FIG. 5 can be used to determine the thermal resistances ($a_{00,00}$–$a_{99,99}$) (e.g., unit of degrees Kelvin/Watts). For example: the value of the coefficient $a_{00,01}$ is the temperature increase in cell 01 for one unit of power in cell 00. As a second example: It can be seen in FIG. 5 that region 22 of device 100 is being heated from the opposite side with one unit of power, applied by the focusing laser 400. By measuring the temperature increase in cell 69, the value of coefficient $a_{22,69}$ can be determined. It is important to note that the power applied to the region does not have to be known as long as the power at the different regions is constant and as long as the total power is known in the package and the device. When the total power in the device and package is not known, and if the exact power deposited in the different regions by the heat source is not known, then only relative power maps can be obtained.

In one embodiment, the coefficients $a_{00,00}$–$a_{99,99}$ are measured independently with the laser. For example, to measure $a_{04,12}$, the laser is positioned in cell 04 and one unit of power is applied. Then the temperature in cell 12 is measured. In another embodiment, the laser is positioned in the cell 00 and then the temperature distribution yielding the coefficients from $a_{00,00}$ to $a_{00,99}$ is measured. Then, the laser is focused on cell 01 and the coefficients from $a_{01,00}$ to $a_{01,99}$ are measured. It will be understood to those of average skill in the art that the equations are based on Green's Theorem. The present method and apparatus is based on a linear relationship between power and temperature and steady state temperature distributions. It is important to note, that for those of average skilled in the art, it is an obvious extension to modify the present invention for non-linear thermal conductivity systems and for transient systems.

The Equation

Figure 7:
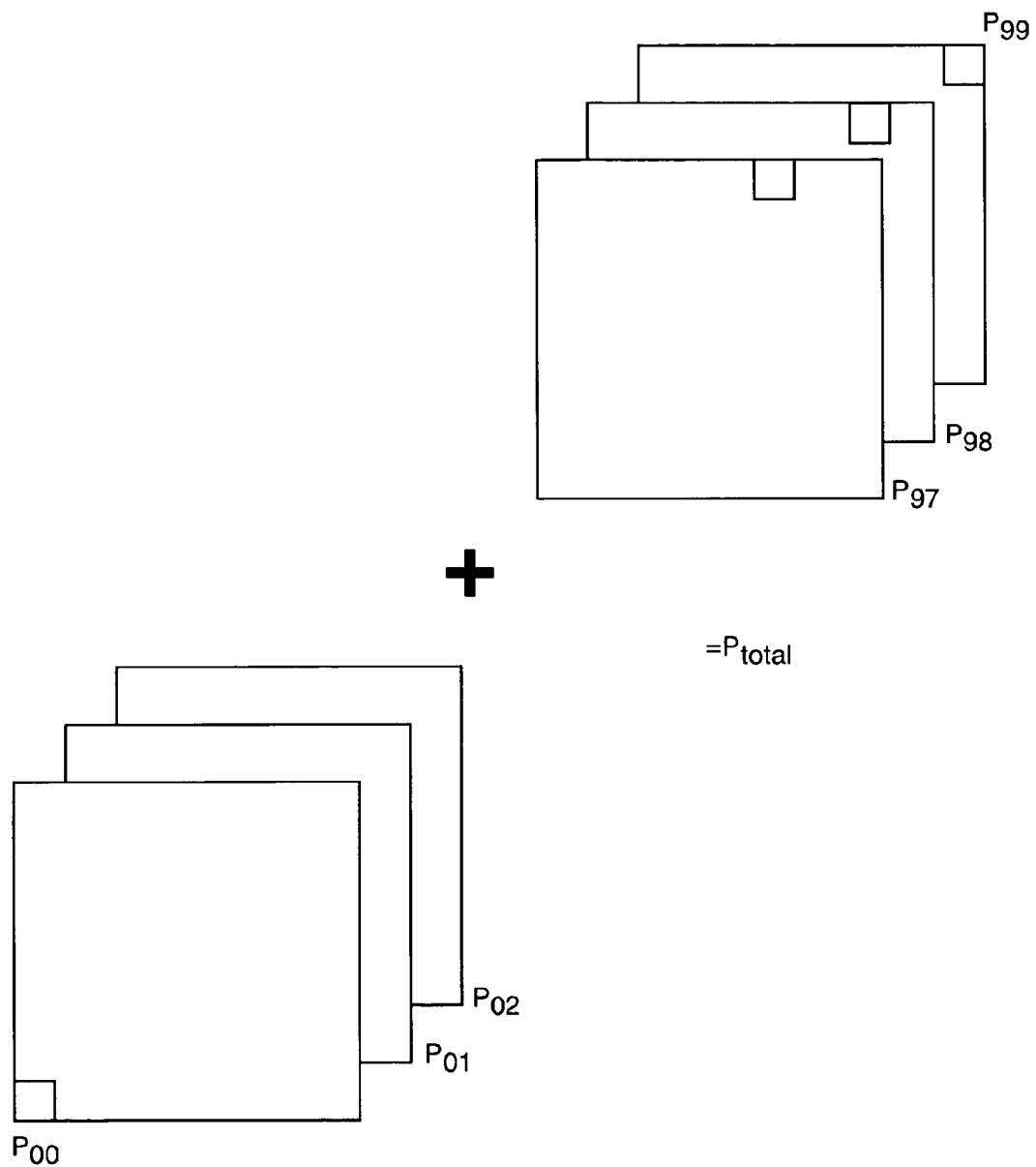
FIG. 7 is a graphical illustration of the equations of FIG. 6, according to the present invention.

Now that all of the known values have been determined, FIG. 6 shows the n+1 equations for solving for the power density values $P_{00}$–$P_{99}$ and $P_{TOTAL}$ in accordance with the method of the present invention. As is shown in equation 602, $P_{TOTAL}$ is found by adding the individual power values $P_{00}$–$P_{99}$. FIG. 7 graphically shows equation 602.

Referring back to FIG. 6, the matrix equation 704 will be easily understood by those having normal skill in the art. Each temperature value $T_{00} \rightarrow T_{99}$ is the product of the coefficient $a_{00,00} \rightarrow a_{99,99}$ and a power value $P_{00} \rightarrow P_{99}$. Equations 706 show the resultant set of linear equations. Because the coefficients $a_{00,00} \rightarrow a_{99,99}$ are known and a temperature value $T_{00} \rightarrow T_{99}$ is known for each linear equation, there is one more known value than unknown value. Therefore, solving for the linear set of equations, which is well known by those having skill in the art, will yield a full power map of the device under test. In some case it may be preferred to fit the power coefficients for the linear set of equations with some constraints. For example, it may preferred that the $P_{00} \rightarrow P_{99}$ can only have positive values or that the equations are fitted with a known power map.

In the manner just described, it is now, for the first time, possible to map the real-time temperature and power distributions of a fully operating electronic device chip.

Figure 8:
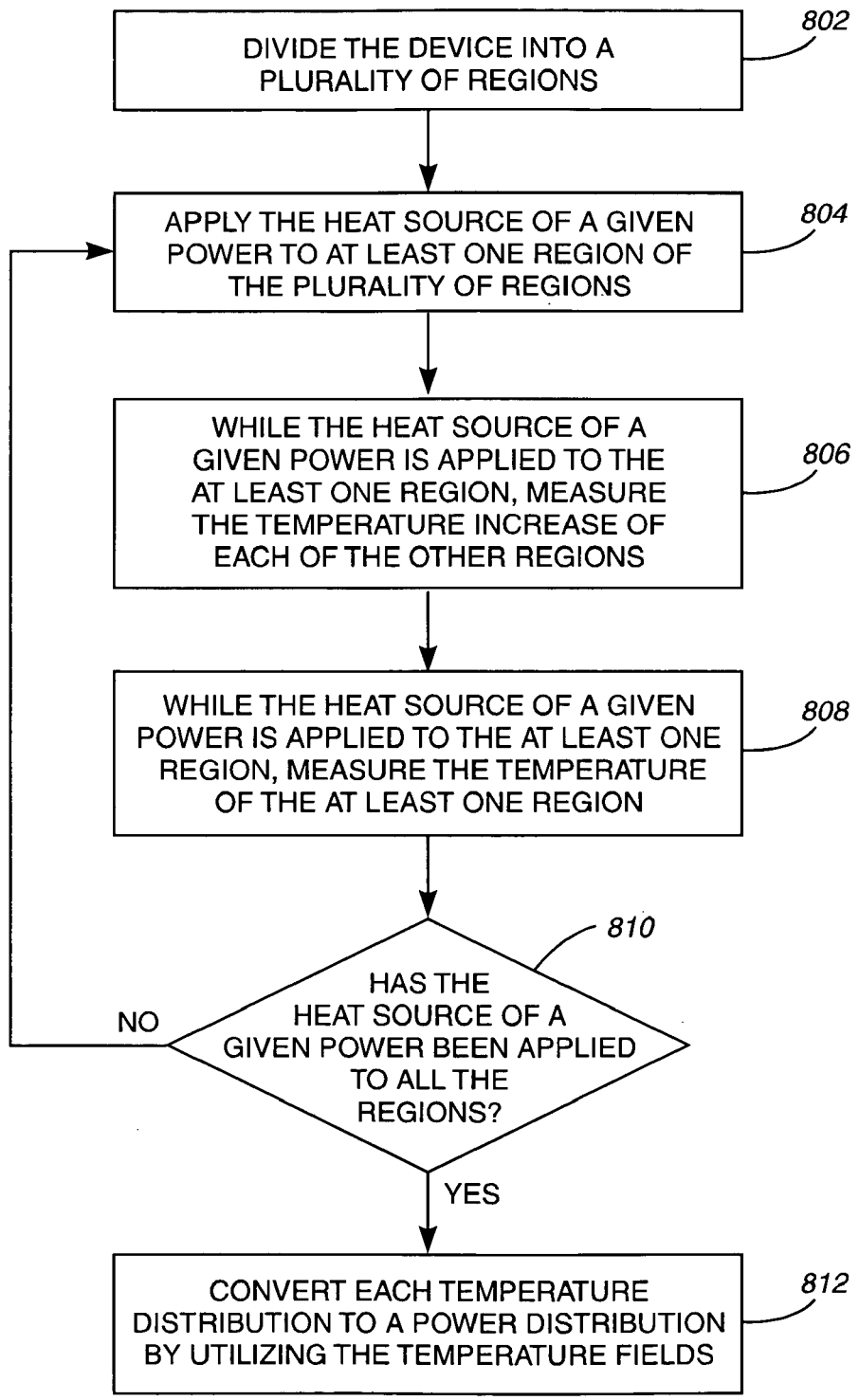
FIG. 8 is a flow chart illustrating the steps for one embodiment of determining the power distribution of a device, according to the present invention.

The flow chart of FIG. 8 further clarifies the present invention by showing the steps for one embodiment of determining the power distribution of a device 100. In the first step 802, the device 100 is divided into a plurality of regions. A heat source of a given power and size is then applied to one of the regions in step 804. While the heat source of a given power and size is applied to the region, the temperature increase of the other regions is measured in step 806. In step 808, the temperature of the region with the heat source of a given power and size applied is measured. In step 810, a check is made to determine whether any regions remain that have not had the heat source applied directly to them. If any regions remain, the process moves back to step 804 and the heat source of a give power is applied to one of the remaining regions, and in step 806, the temperature increase of the other regions is measured, and then in step 808, the temperature of the region with the heat source of a given power and size applied is measured. A check is again made in step 810. Finally, if all of the regions have had the heat source applied to them, the process moves to final step 812 where the temperature distributions measured in step 806 and temperature fields measured in step 808 are converted to power distributions. FIG. 10 is an exemplary PV-Code code for solving the linear equations of FIG. 6, according to the present invention. Those skilled in the art realize that the exemplary code may be implemented in other languages such as C, C++, Java and others within the true scope and spirit of the present invention.

Figure 9:
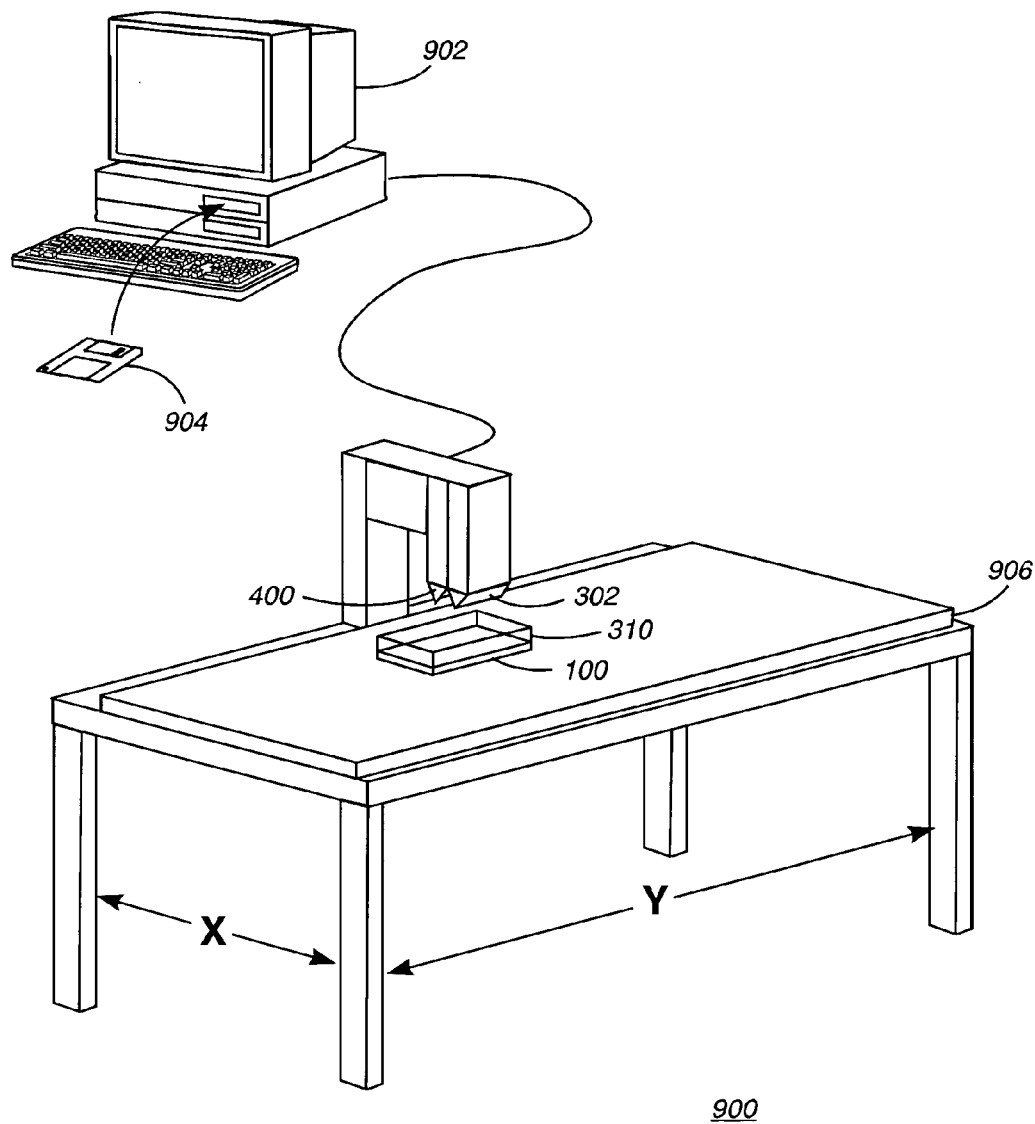
FIG. 9 is a block diagram of a system for measuring temperature and power distributions of electronic device in accordance with the present invention.

FIG. 9 shows a system 900 for measuring temperature and power distributions of a fully operating electronic device in accordance with the present invention. The system 900 includes a computer 902 and a computer readable medium 904 that holds instructions that the computer can execute in accordance with the present invention. The computer 902 is connected to table 906 that holds the electronic device 100 with a heat sink 310 attached. Located above the device 100 and heat sink 310 is a heat source 400 and a infrared camera 302.

By placing the computer readable medium 904 into the computer 902, the computer 902 can read instructions contained on the medium 904 and control the system to measure the power distribution. In one embodiment, the heat source 400 move in relation to the device 100 in the X-Y direction. In a second embodiment the table 906 moves the device 100 and heat sink 310 in the X-Y directions in relation to the photon detector 302 and heat source 400. The computer 902 is able to control the movements in either embodiment. The computer 902 is able to communicate with the photon detector 302 and record the temperature values of the regions on the device 100. The computer can then quickly process and solve the linear equations described above and definitively determine the power distribution values using the exemplary program of FIG. 10.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A computer-implemented method for determining a power distribution of an operating electronic device, the computer-implemented method comprising:

applying a heat source of a given power and size to the device;

measuring at least one temperature field on the device in response to the heat source applied thereto;

measuring at least one temperature distribution of the device; and converting each temperature distribution to a power distribution by utilizing the temperature fields, wherein measuring the at least one temperature field comprises:

receiving a thermal image of the device with a photon detector; and using the thermal image of the device to determine the temperature distribution.

2. The method according to claim 1, wherein measuring the at least one temperature distribution comprises:

dividing the device into a plurality of regions;

applying the heat source of a given power and size to at least one region of the plurality of regions; and while the heat source of a given power and size is applied to the at least one region, measuring the temperature increase of each of the plurality of regions.

3. The method according to claim 2, wherein measuring the at least one temperature distribution comprises:

receiving a thermal image of each region on the device with a photon detector; and interpreting the thermal image of each region on the device to determine the temperature.

4. The method according to claim 1, wherein converting to a power distribution for n·m regions comprises solving for all $P_0 \rightarrow P_{n+m}$, values in the following equations:

$$P_{00} + P_{01} + P_{02} + \ldots P_{m+n} = P_{total}$$

$$\begin{pmatrix} a_{0,0} & a_{0,1} & a_{0,2} & \ldots & a_{0,n-1} & a_{0,n} \\ a_{1,0} & a_{1,1} & a_{1,2} & \ldots & a_{1,n-1} & a_{1,n} \\ \vdots & \vdots & \vdots & & \vdots & \vdots \\ a_{m,0} & a_{m,1} & a_{m,2} & \ldots & a_{m,n-1} & a_{m,n} \end{pmatrix} \cdot \begin{pmatrix} P_{00} \\ P_{01} \\ \vdots \\ P_{m+n} \end{pmatrix} = \begin{pmatrix} T_{00} \\ T_{01} \\ \vdots \\ T_{m+n} \end{pmatrix}$$

where the coefficients $a_{0,0} \rightarrow a_{m,n}$ are values of temperature increases for each region with a heat source of a given power and size applied to a given region; and where $T_0 \to T_{m+n}$ are the temperature at each region, which corresponds to the power distribution.

5. A computer program product for determining a power distribution of a fully operating electronic device, the computer program product comprising:

a storage medium readable by a processing circuit and storing instructions for execution by the processing circuit for performing a method comprising:

applying a heat source of a given power and size to the device;

measuring at least one temperature field on the device in response to the heat source applied thereto;

measuring at least one temperature distribution of the device; and converting each temperature distribution to a power distribution by utilizing the temperature fields, wherein measuring the at least one temperature field comprises:

receiving a thermal image of the device with a photon detector; and using the thermal image of the device to determine the temperature.

6. The computer program product according to claim 5, wherein measuring the at least one temperature distribution comprises:

dividing the device into a plurality of regions;

applying the heat source of a given power and size to at least one region of the plurality of regions; and while the heat source of a given power and size is applied to the at least one region, measuring the temperature increase of each of the plurality of regions.

7. The computer program product according to claim 6, wherein measuring the at least one temperature distribution comprises:

receiving a thermal image of each region on the device with a photon detector; and interpreting the thermal image of each region on the device to determine the temperature.

8. The computer program product according to claim 5, wherein converting to a power distribution for n·m regions comprises solving for all $P_0 \to P_{n+m}$, values in the following equations:

$$P_{00} + P_{01} + P_{02} + \ldots P_{m+n} = P_{total}$$

$$\begin{pmatrix} a_{0,0} & a_{0,1} & a_{0,2} & \ldots & a_{0,n-1} & a_{0,n} \\ a_{1,0} & a_{1,1} & a_{1,2} & \ldots & a_{1,n-1} & a_{1,n} \\ \vdots & \vdots & \vdots & & \vdots & \vdots \\ a_{m,0} & a_{m,1} & a_{m,2} & \ldots & a_{m,n-1} & a_{m,n} \end{pmatrix} \cdot \begin{pmatrix} P_{00} \\ P_{01} \\ \\ P_{m+n} \end{pmatrix} = \begin{pmatrix} T_{00} \\ T_{01} \\ \\ T_{m+n} \end{pmatrix}$$

where the coefficients $a_{0,0} \to a_{m,n}$ are values of temperature increases for each region with a heat source of a given power and size applied to a given region; and where $T_0 \to T_{m+n}$ is the corresponding temperature at each region.

9. The computer program product according to claim 5, further comprising:

placing the device in a fully operational mode by placing the device in a production cooling package used during production operation before applying the heat source of a given power and size.

* * * * *